US009711950B2

(12) United States Patent
Zimer et al.

(10) Patent No.: US 9,711,950 B2
(45) Date of Patent: Jul. 18, 2017

(54) DENSE WAVELENGTH BEAM COMBINING WITH VARIABLE FEEDBACK CONTROL

(71) Applicant: TRUMPF Laser GmbH (TLS), Schramberg (DE)

(72) Inventors: Hagen Zimer, Dunningen-Seedorf (DE); Alexander Killi, Trossingen (DE); Steffen Ried, Rottweil (DE); Simon Nagel, Schramberg (DE); Markus Ginter, Schramberg (DE)

(73) Assignee: TRUMPF LASER GMBH, Schramberg (DE)

( * ) Notice: Subject to any disclaimer, the term of this patent is extended or adjusted under 35 U.S.C. 154(b) by 0 days.

(21) Appl. No.: 14/711,579

(22) Filed: May 13, 2015

(65) Prior Publication Data

US 2016/0336714 A1 Nov. 17, 2016

(51) Int. Cl.
| | | |
|---|---|---|
| *H01S 5/40* | (2006.01) | |
| *H01S 3/08* | (2006.01) | |
| *H01S 5/14* | (2006.01) | |
| *H01S 3/10* | (2006.01) | |

(52) U.S. Cl.
CPC ........ *H01S 5/4012* (2013.01); *H01S 3/08054* (2013.01); *H01S 5/141* (2013.01); *H01S 5/4062* (2013.01); *H01S 5/4087* (2013.01); *H01S 3/10061* (2013.01)

(58) Field of Classification Search
CPC ......... H01S 3/23; H01S 5/4012; H01S 5/4062
See application file for complete search history.

(56) References Cited

U.S. PATENT DOCUMENTS

| 5,048,030 A | 9/1991 | Hiiro |
|---|---|---|
| 5,386,426 A * | 1/1995 | Stephens ............... H01S 5/4062 372/101 |
| 6,584,133 B1 | 6/2003 | Walker et al. |
| | (Continued) | |

FOREIGN PATENT DOCUMENTS

| EP | 1265324 A2 | 12/2002 |
|---|---|---|
| WO | WO 2013123256 A1 | 8/2013 |

OTHER PUBLICATIONS

U.S. Appl. No. 14/521,487, Hagen Zimer, et al.

*Primary Examiner* — Tod T Van Roy
(74) *Attorney, Agent, or Firm* — Leydig, Voit & Mayer, Ltd.

(57) ABSTRACT

An external cavity laser apparatus according to an embodiment of the invention is provided. The external cavity laser apparatus includes a plurality of beam emitters that collectively emit a plurality of emitted beams that each includes a primary component emitted beam. A first reflective element is configured to reflect the plurality of primary component emitted beams and a first polarizing optic disposed in the optical path of the plurality of primary component emitted beams is configured to rotate a polarization of each primary component emitted beam to produce a first rotated primary component beam having a first linear polarization and a second rotated primary component beam having a second linear polarization. A polarized beam splitter is configured to direct first feedback system output component beams into an output beam, and to direct second feedback system output component beams to the plurality of beam emitters as feedback beams.

27 Claims, 7 Drawing Sheets

(56) References Cited

U.S. PATENT DOCUMENTS

| | | |
|---|---|---|
| 8,553,327 B2 | 10/2013 | Chann et al. |
| 8,724,222 B2 | 5/2014 | Chann et al. |
| 2011/0305256 A1* | 12/2011 | Chann ................ G02B 27/0905 372/75 |
| 2015/0104180 A1 | 4/2015 | Zimer et al. |
| 2015/0146282 A1 | 5/2015 | Huber et al. |
| 2015/0333485 A1* | 11/2015 | Tayebati ............... H01S 3/0826 359/487.04 |

* cited by examiner

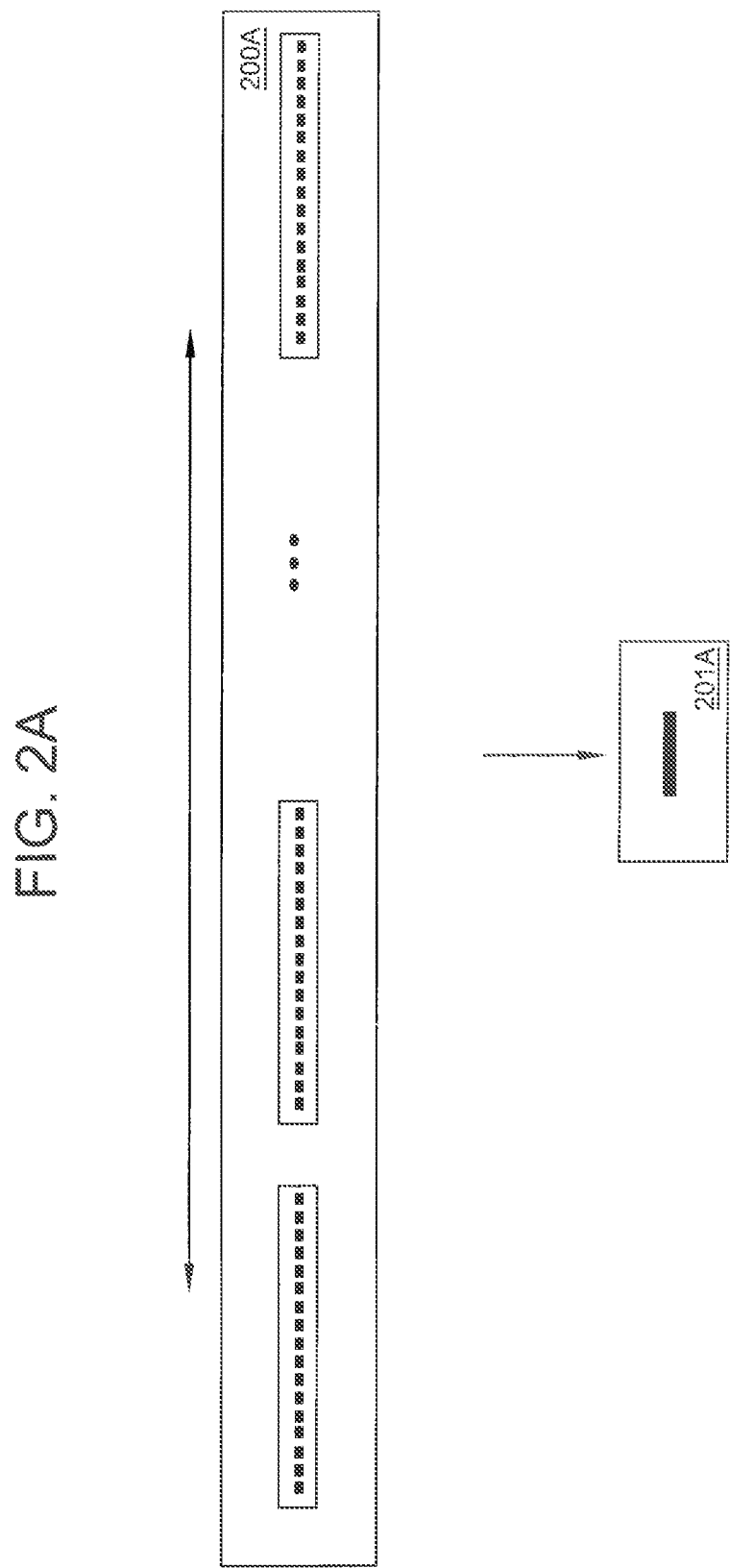

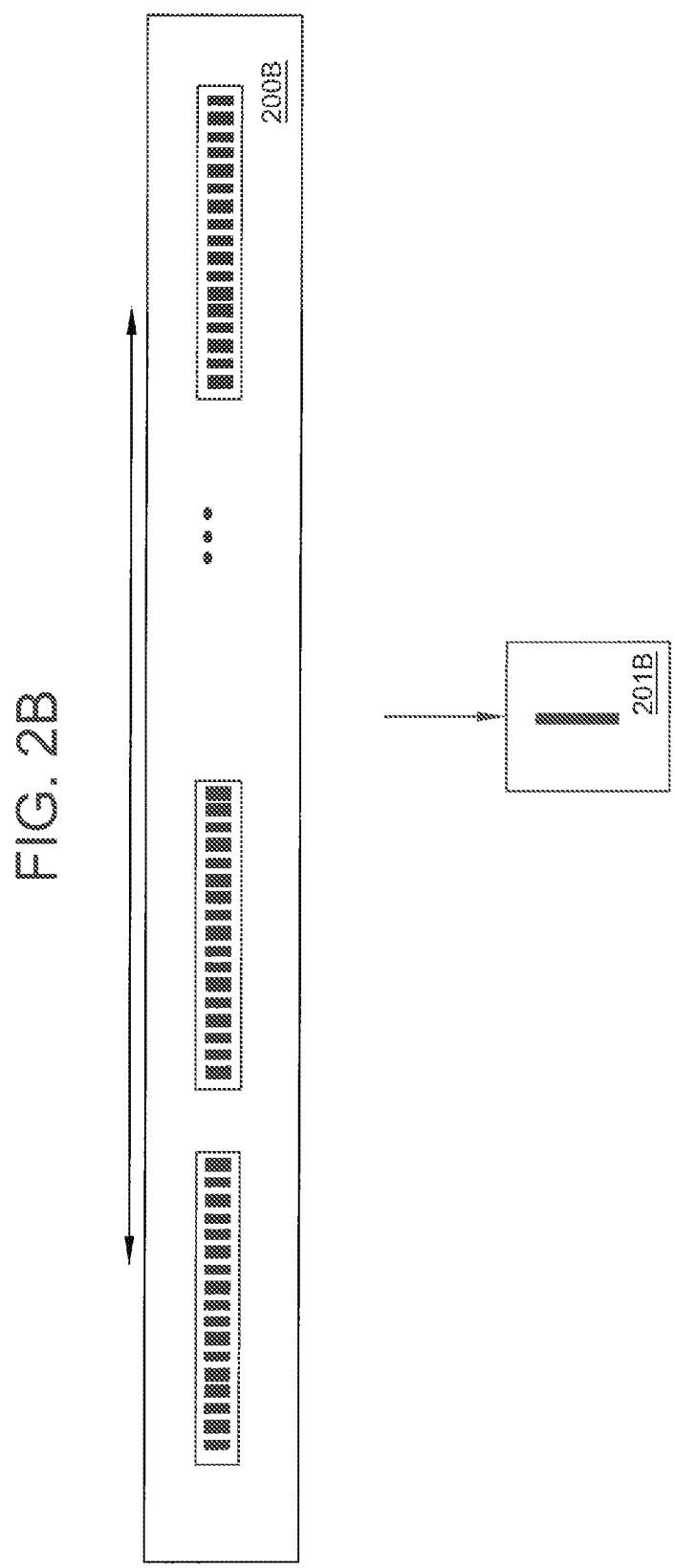

DENSE WAVELENGTH BEAM COMBINING WITH VARIABLE FEEDBACK CONTROL

TECHNOLOGY FIELD

The present disclosure relates generally to laser systems and more particularly to systems and methods for narrow-bandwidth laser beam stabilization and multiple laser beam combining.

BACKGROUND

Dense wavelength beam combining (DWBC) techniques spatially superimpose a plurality of input beams to produce a single combined high power output beam. In order to ensure that the combined high power output beam is of sufficiently high quality, i.e. has a sufficiently small beam parameter product (BPP), for desired applications, DWBC techniques provide for wavelength-locking of the individual emitters that emit the plurality of input beams. Wavelength-locking refers to narrowing the emission spectrum of an emitter about a particular wavelength by causing the emitter to emit a substantial majority of its radiation within a narrow wavelength spectrum. DWBC techniques achieve wavelength-locking by providing feedback to each individual emitter that stimulates emission of radiation at wavelengths within the narrow spectrum thereby decreasing the relative population of radiation at undesired wavelengths.

Without wavelength-locking, individual emitters will emit larger portions of radiation at non-desired wavelengths. Radiation at non-desired wavelengths increases the BPP of combined beams produced by spectral-angular dispersive elements, e.g. diffraction gratings. Additionally, radiation having non-desired wavelengths can induce temporal fluctuation in the output power by means of spectral crosstalk between neighboring emitters. Spectral crosstalk refers to the situation where a portion of the radiation emitted by one individual emitter is directed into a different individual emitter as feedback. In order to limit the levels of radiation emitted at non-desired wavelengths and thereby increase the fidelity of the wavelength-locking process, DWBC techniques can utilize wavelength filtering elements. Wavelength filtering elements are designed to remove radiation having non-desired wavelengths from the low power input beams as those beams propagate through external cavities. For example, DWBC techniques and apparatuses including wavelength filtering elements are described in U.S. patent application Ser. No. 14/053,187, U.S. patent application Ser. No. 14/087,985, and U.S. patent application Ser. No. 14/521,487, all of which are incorporated herein by reference.

SUMMARY OF THE INVENTION

An external cavity laser apparatus according to an embodiment of the invention is provided. The external cavity laser apparatus includes a plurality of beam emitters that collectively emit a plurality of emitted beams each including a primary component emitted beam and having a wavelength, an angular dispersive optic disposed in the optical path of the plurality of primary component emitted beams and configured to combine the plurality of primary component emitted beams into a combined input beam, the combined input beam including a plurality of component input beams, a first polarizing optic disposed in the optical path of the combined input beam and configured to rotate a polarization of each of the plurality of component beams of the combined input beam to produce a rotated combined input beam, the rotated combined input beam including a plurality of rotated component input beams, and rotate a polarization of a reflection of each of the plurality of rotated component input beams of the rotated combined input beam to produce a first combined feedback system output beam having a first linear polarization and a second combined feedback system output beam having a second linear polarization, wherein the first combined feedback system output beam includes a plurality of first feedback system output component beams and wherein the second combined feedback system output beam includes a plurality of second feedback system output component beams. The external cavity laser apparatus according to the embodiment of the invention further includes a polarized beam splitter configured to direct the first combined feedback system output beam as a combined output beam, and direct the second combined feedback system output beam to the angular dispersive optic as a first combined feedback beam and back to the plurality of beam emitters to stabilize the wavelengths of the plurality of emitted beams.

A method for stabilizing the wavelengths of a plurality of emitted beams collectively emitted by a plurality of emitters according to an embodiment of the invention is provided. The method includes emitting, by the plurality of emitters, the plurality of emitted beams collectively including a plurality of primary component emitted beams, and combining, by an angular dispersive optic disposed in the optical path of the plurality of primary component emitted beams, the plurality of primary component emitted beams into a combined input beam, the combined input beam including a plurality of component input beams. The method according to the embodiment of the invention additionally includes rotating, by a first polarizing optic, the plurality of component beams of the combined input beam to produce a rotated combined input beam, the rotated combined input beam including a plurality of rotated component input beams, and rotating, by the first polarizing optic, the plurality of rotated component beams of the rotated combined input beam to produce a first combined feedback system output beam having a first linear polarization and a second combined feedback system output beam having a second linear polarization, wherein the first combined feedback system output beam includes a plurality of first feedback system output component beams and wherein the second combined feedback system output beam includes a plurality of second feedback system output component beams. The method according to the embodiment of the invention further includes directing, by the polarized beam splitter, the first combined feedback system output beam as a combined output beam, and directing, by the polarized beam splitter, the second combined feedback system output beam to the angular dispersive optic as a first combined feedback beam and back to the plurality of beam emitters to stabilize the wavelengths of the plurality of emitted beams.

An external cavity laser apparatus according to an embodiment of the invention is provided. The external cavity laser apparatus includes a plurality of beam emitters that collectively emit a plurality of emitted beams each having a wavelength and including a primary component emitted beam and a secondary component emitted beam, an angular dispersive optic disposed in the optical path of the plurality of emitted beams and configured to combine the plurality of emitted beams into a combined input beam, the combined input beam including a primary combined input beam and a secondary combined input beam, a first polarizing optic disposed in the optical path of the primary combined input beam and configured to rotate the primary combined input beam to produce a rotated primary combined input beam, and rotate a reflection of the rotated primary combined input beam to produce a first combined feedback system output beam having a first linear polarization and a second combined feedback system output beam having a second linear polarization, wherein the first combined feedback system output beam includes a plurality of first feedback system output component beams and wherein the second combined feedback system output beam includes a plurality of second feedback system output component beams. The external cavity laser apparatus according to the embodiment of the invention further includes a polarized beam splitter configured to direct the primary combined input beam through the first polarizing optic at a first reflective element, and direct the secondary combined input beam at a second reflective element, the second reflective element configured to reflect the secondary combined input beam as a third combined feedback system output beam, direct the first combined feedback system output beam as a combined output beam, direct the second combined feedback system output beam to the angular dispersive optic as a first combined feedback beam and back to the emitters to stabilize the wavelengths of the emitted beams, and direct the third combined feedback system output beam one of to the angular dispersive optic as a second combined feedback beam or as a component of the combined output beam.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIGS. 2A and 2B illustrate configurations of laser sources for use in an external cavity laser apparatus wherein the laser sources are arrays of diode lasers formed from horizontal stacks of diode bars;

DETAILED DESCRIPTION OF THE DRAWINGS

Figure 1:
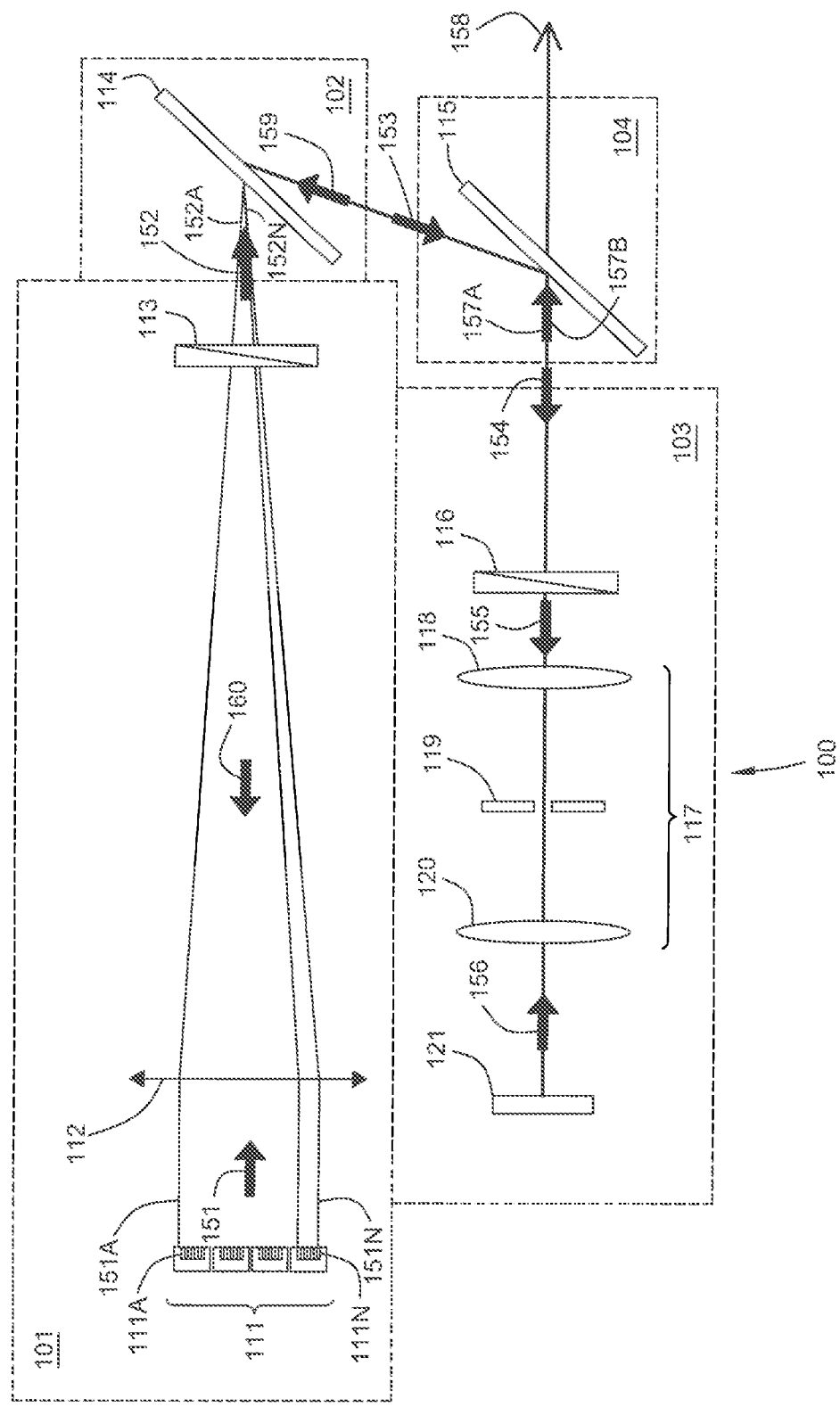
FIG. 1 illustrates an apparatus, according to an embodiment of the invention, for producing, via dense wavelength beam combining (DWBC) techniques, a single, multi-wavelength output laser beam comprising a plurality of spatially and directionally overlapped beams that each has a narrow wavelength spectrum.

A variety of dense wavelength beam combining (DWBC) techniques and apparatuses are described herein that involve combining a plurality of individual input beams into a single combined output beam. In order to produce a combined output beam that possesses the combination of sufficiently high power and sufficiently high beam quality required by various applications, it is necessary to combine large numbers of relatively low power input beams through precise spatial and directional overlapping. Certain applications, for example material processing applications such as laser cutting of sheet metal having a thickness of approximately 10 mm, require a beam quality of less than 5 mm·mrad and a laser power in the kW range. DWBC techniques and apparatuses often provide for precise spatial and directional overlapping of low power input beams via an external resonator cavity configured to provide feedback to the individual emitters that emit the low power input beams. However, the amount of feedback received by each individual emitter is strongly dependent upon a number of factors, which include the imaging quality of the external resonator cavity, the reflectivity and transparency of the various optical components utilized in the external resonator cavity, and the reflectivity of the surfaces through which the feedback enters the individual emitters.

During the manufacturing of DWBC apparatuses, variations in the amount of feedback provided by the DWBC apparatus to the individual emitters can arise from various sources. In order to limit the reflectivity of the surfaces through which the feedback enters internal resonator cavities, anti-reflective (AR) coatings can be applied to surfaces of the individual emitters. However, despite the application of AR coatings, surfaces of the individual emitters nevertheless retain a residual reflectivity. The residual reflectivity can vary as a result of the process by which the AR coating was applied and of the AR coating itself. Variation in the amount of feedback provided by the DWBC apparatuses can also vary as a result of small misalignments resulting during manufacturing or otherwise. During operation of DWBC apparatuses, components can become hot and thereby produce variations in the amount of feedback provided by the DWBC apparatuses.

State of the art DWBC architectures rely on dielectric output mirrors with a fixed reflectivity to provide feedback to the individual emitters. However, in practice, reduction in the amount of feedback provided to the individual emitters as a result of system variations introduced during manufacturing, operation, or otherwise can potentially lead to a spectrally non-stabilized (free running) operation mode of one or more of the emitters. In consequence, the beams emitted by such emitters cannot be properly integrated into a combined output beam and the beam parameter product (BPP) of the combined output beam will increase. As a result, the performance of the DWBC apparatus may not be acceptable for certain applications.

In principle, a reduction in the amount of feedback resulting from manufacturing and operational tolerances can be compensated for by increasing the reflectivity of external feedback elements to re-obtain the required spectral-locking range. However, in order to provide the flexibility to increase the effective reflectivity of the external feedback element, an external resonator capable of providing adjustable levels of feedback is required. According to an embodiment of the invention, a DWBC apparatus having a variable feedback system that relies on polarizing beam splitting is provided. Light emitting laser diodes utilized in DWBC apparatuses are typically strongly transverse electric (TE) polarized, and only a small portion of the optical power emitted by such laser diodes is coupled back into the emitter while a major portion is coupled out of the external resonator cavity as a combined output beam. Such functionality can be achieved through a sequential arrangement of a polarizing beam splitter, a birefringent optic, and a high reflectivity (HR) mirror.

Linearly polarized light of a combined beam leaving an angular-dispersive optical element can be entirely reflected into a feedback branch, or feedback system, by means of the polarized beam splitter. Within the feedback system, the linearly polarized light is depolarized via the birefringent optic. The depolarized light can be directed through an optional spatial-frequency filter to remove non-selected angular-frequency modes. Thereafter, the depolarized light is reflected by an HR mirror and depolarized for a second time by the quarter wave plate. The optical power carried by the depolarized light emerges after being depolarized (for the second time) from the quarter wave plate as a combined beam formed of two components having orthogonal linear polarization states. Rotation of the quarter wave plate allows for adjustment of the relative optical power carried by each component. As one component is transmitted by the polarizing beam splitter and the other is reflected back into the plurality of individual emitters by the polarizing beam splitter, the effective reflectivity of the external resonator cavity can be adjusted through simple rotation of the birefringent optic. The adjustability of the effective reflectivity of the external resonator can be used to compensate for variations in the manufacturing tolerances of various system components and allow lower cost components to be utilized in system construction. The adjustable effective reflectivity of the external resonator also enables increased production build yield.

FIG. 1 illustrates an apparatus, according to an embodiment of the invention, for producing, via dense wavelength beam combining (DWBC) techniques, a single, multi-wavelength, combined output laser beam that includes a plurality of spatially and directionally overlapped individual laser beams. The DWBC apparatus 100 includes input generation system 101, beam combining system 102, adjustable feedback system 103, and beam splitting system 104.

The input generation system 101 provides a means for producing each of the plurality of individual laser beams used in forming the combined output laser beam. The plurality of individual laser beams produced by the input generation system 101 are referred to in the description of FIG. 1 as external resonator input beams, or emitted beams, 151. The input generation system 101 includes a laser source 111 and also includes a position-to-angle transform optic 112 and a birefringent optic 113. However, the position-to-angle transform optic 112 and the birefringent optic 113 may alternatively or additionally be considered to be part of the beam combining system 102 and/or the adjustable feedback system 103 as both optics interact with the plurality of external resonator input beams, or emitted beams, 151 in a manner that impacts their downstream properties, e.g. the properties of beam combiner input beams 152 and the properties of the combined input beam 153.

The beam combining system 102 provides a means of producing a single, multi-wavelength, combined input beam, i.e. combined input beam 153, from a plurality of individual laser beams referred to in the description of FIG. 1 as the beam combiner input beams 152. The beam combining system 102 includes angular-dispersive beam combining optic 114. In the embodiment depicted in FIG. 1, the angular dispersive beam combining optic is a polarization dependent optic. However, in alternative embodiments a polarization independent optic can be used.

The adjustable feedback system 103 provides a means for dividing optical power carried in a combined, multi-wavelength laser beam referred to in the description of FIG. 1 as combined feedback system input beam, or rotated combined input beam, 154 between a first combined feedback system output beam 157A, which includes a plurality of first feedback system output component beams, and a second combined feedback system output beam 157B, which includes a plurality of second feedback system output component beams, respectively. The adjustable feedback system 103 includes an adjustable birefringent optic 116 and a highly reflective (HR) mirror 121. Optionally, the adjustable feedback system 103 can also include a spatial filtering element 117.

The beam splitting system 104 includes a polarizing beam splitter 115 that separates the first combined feedback system output beam 157A and the second combined feedback system output beam 157B. The beam splitting system 104 also directs the combined external resonator output beam 158 out of the external resonator and directs the combined feedback beam 159 at the angular-dispersive beam combining optic 114.

In the embodiment illustrated in FIG. 1, the input generation system 101 includes a plurality of individual emitters (e.g. 111A and 111N) that each emit a single laser beam and that collectively make up laser source 111. Each individual beam emitted by an individual emitter in the laser source 111 is a constituent of the external resonator input beams 151. For simplicity, the external resonator input beams 151 will be referred to simply as emitted beams 151 for the remainder of the description of FIG. 1. The emitted beams 151 include, e.g., emitted beam 151A and emitted beam 151N.

The individual emitters of the laser source 111 may be diode lasers, fiber lasers, solid-state lasers, or any other type of lasers. The plurality of individual emitters may be arranged in a one dimensional array, a two dimensional array, or a variety of other configurations. For example, the laser source 111 may be an array of diode lasers formed from vertical or horizontal stacks of diode bars, each of which has a plurality of individual diode laser emitters. The laser source 111 may be any array of diode lasers configured as depicted in any of FIGS. 2A-B, 3A-C, and 4. However, the laser source 111 is not limited to such configurations, and embodiments described herein contemplate that a variety of alternative laser source configurations may be used as well. The configurations of the laser source 111 depicted in FIGS. 2A-B, 3A-C, and 4 may be any of a geometrically stacked configuration (a geometric stack), an optically stacked configuration (an optical stack), or another configuration.

In the embodiment depicted in FIG. 1, diode laser emitters can be used for the laser source 111. Diode laser emitters (as well as other types of emitters) are often marketed as transverse electric (TE) or transverse magnetic (TM) in reference to the polarization state of the beams they emit. However, it is possible that, due to manufacturing tolerances, diode lasers marketed as TE emit beams that include a small TM component and vice verse. In the remaining discussion of FIG. 1, it is assumed that each emitter of the laser source 111 emits a beam that has a TE polarization state, i.e. it is assumed that any TM component of constituents of the emitted beams 151 is negligible. Therefore, in FIG. 1 the emitted beams 151 are a plurality of individual, single-wavelength laser beams that each has a TE polarization state.

Each of the plurality of emitters of the laser source 111 emits a constituent of the emitted beams 151 that includes a preferred resonant mode component and an alternative resonant mode component. The preferred resonant mode component consists of photons having a wavelength that falls within a narrow spectral band that corresponds to a preferred resonant mode of the emitter of the laser source 111 that emitted the constituent beam. The alternative resonant mode component consists of photons having a wavelength that falls outside of the narrow spectral band that corresponds to the preferred resonant mode of the emitter of the laser source 111 that emitted the constituent beam. Alternative resonant mode components of constituents of the emitted beams 151 that propagate through the external resonator will not be spatially and directionally overlapped upon emerging from the polarizing beam splitter 115 but will instead possess a residual angular spectrum. Therefore, alternative resonant mode components of constituents of the emitted beams 151 can increase the BPP of the combined input beam 153 and of the combined external resonator output beam 158. To increase the quality of the beam output by the system, it is possible to mitigate the impact of such alternative resonant mode components by incorporating the spatial filtering element 117 into the adjustable feedback system 103 as described infra.

Each emitter in the laser source 111 has a particular, fixed location with respect to the position-to-angle transform optic 112. Therefore, the emitted beams 151 have a position spectrum that corresponds to the spatial distribution of the emitters in the laser source 111. For example, the position of the emitted beam 151A corresponds to the position of the individual emitter 111A, while the position of the emitted beam 151N corresponds to the position of the individual emitter 111N.

Although not shown in the embodiment illustrated in FIG. 1, embodiments of the invention can include a variety of optics for manipulating beams emitted by the laser source 111 prior to their interaction with the position-to-angle transform optic 112. Typically, beams emitted by diode lasers have an asymmetric beam profile, i.e. the beam diverges at disparate rates along two axes defined perpendicular to its direction of propagation. The two axes can be identified as a fast axis, along which the beam diverges more rapidly, and a slow axis, upon which the beam diverges comparatively more slowly. Such manipulation of the beams may be referred to as preprocessing and can include, e.g., rotation of the beams such that downstream processing is performed along a fast axis rather than a slow axis, collimation of the beams along the fast axis, and collimation of the beams along the slow axis. A variety of prior art literature discusses preprocessing techniques for beams emitted by diode laser emitters. For example, the beams emitted by the laser source 111 may be manipulated as described in U.S. patent application Ser. No. 14/053,187 or as described in U.S. Pat. Nos. 8,724,222 and 8,553,327, all of which are incorporated by reference herein.

The position-to-angle transform optic 112 transforms the position spectrum of the emitted beams 151 into an angular spectrum of the beam combiner input beams 152. In the embodiment depicted in FIG. 1, the angular spectrum of the beam combiner input beams 152 refers to the set of angles of transmission of the beam combiner input beams 152 with respect to the position-to-angle transform optic 112. The position-to-angle transform optic 112 converts a position of each of the emitted beams 151 (which corresponds to a position of an emitter of the laser source 111) into an angle of incidence with respect to the angular dispersive optic 114 of the beam combining system 102. Specifically, the angular spectrum of the beam combiner input beams 152 determines a set of angles of incidence with respect to the angular dispersive optic 114. Therefore, the beam combiner input beams 152 have an angular spectrum that is determined by the spatial distribution of the emitters in the laser source 111 and the position-to-angle transform optic 112. For example, the position-to-angle transform optic 112 transforms a position of the emitted beam 151A into an angle of incidence of the beam combiner input beam 152 with respect to the angular dispersive optic 114.

The birefringent optic 113, which can be referred to as, e.g. a second polarizing optic, rotates the polarization state of the emitted beams 151 such that the polarization state of each constituent of the beam combiner input beams 152 is rotated with respect to the corresponding component of the emitted beams 151. In the embodiment depicted in FIG. 1, the birefringent optic 113 is a half wave plate that rotates the TE polarization state of the emitted beams 151 to provide the beam combiner input beams 152 with a TM polarization state. Different birefringent optics may be used in different embodiments.

The beam combining system 102 includes the angular dispersive optic 114. The angular dispersive optic 114 transforms the angular spectrum possessed by the beam combiner input beams 152 (which was imparted by the position-to-angle transform optic 112) into a wavelength-dependent angular spectrum. The angular dispersive optic 114 is disposed relative to the position-to-angle transform optic 112 such that a preferred resonant mode component of each constituent of the beam combiner input beams 152 emerges from the angular dispersive optic 114 with a common direction of propagation and as a component of the combined input beam 153. In the embodiment depicted in FIG. 1, the angular dispersive optic 114 is a polarization dependent optic, and specifically, a polarization dependent grating. However, in alternative implementations, polarization independent optics, e.g. polarization independent gratings, can be used. The combined input beam 153 is a combined multi-wavelength beam that includes a plurality of individual constituent beams, each of which corresponds to a constituent of the emitted beams 151. The combined input beam 153 carries its optical power in the TM polarization state.

In the embodiment depicted in FIG. 1, which includes the optional spatial filtering element 117, the relative positioning and properties of the transform optic 112 of the input generation system 101, the angular dispersive optic 114 of the beam combining system input 102, and the optional spatial filtering element 117 can thereby select a preferred resonant mode component of each of the emitted beams 151 that is allowed to propagate through the external resonator system. Alternative resonant mode components of each of the emitted beams 151 are filtered out of the external resonator system. Specifically, the alternative resonant mode components of each constituent of the beam combiner input beams 152 emerge from the angular dispersive optic 114 at an angle with respect to the common direction of propagation of the combined input beam 153 and are subsequently filtered out of the system by the optional spatial filtering element 117 of the adjustable feedback system 103.

The adjustable feedback system 103 receives the combined feedback system input beam 154. The combined feedback system input 154 is a reflection of the combined input beam 153 off of the polarizing beam splitter 115, which, in the embodiment depicted in FIG. 1, is configured to reflect beam components having a TM polarization state and transmit beam components having a TE polarization state. The combined feedback system input beam 154 is a combined multi-wavelength laser beam that includes a plurality of individual constituent beams (each of which corresponds to a constituent of the emitted beams 151) having TM polarization states. The adjustable feedback system 103 includes an adjustable birefringent optic 116 that rotates the polarization state of the combined feedback system input beam 154 in order to produce the combined spatial filter input beam, or rotated combined input beam, 155. In the embodiment depicted in FIG. 1, the adjustable birefringent optic 116 is a rotatable quarter wave plate that rotates the polarization state of the combined feedback system input beam 154 into a combination of TE and TM polarization states and introduces a phase shift between the TE and TM polarization states thereby providing the combined spatial filter input beam, or rotated combined input beam, 155 with an elliptical, e.g. circular, polarization state. The combined spatial filter input beam, or rotated combined input beam, 155 is therefore a combined multi-wavelength laser beam that includes a plurality of individual constituent beams (i.e. rotated component input beams) and carries its optical power in a combination of TE and TM polarization states.

In the embodiment depicted in FIG. 1, the adjustable birefringent optic 116 is an achromatic optic (specifically an achromatic quarter wave plate) that provides broadband achromatic rotation of polarization states of incoming beams. Such an achromatic quarter wave plate can be constructed from multiple plates of birefringent materials. For example, the adjustable birefringent optic 116 can be constructed from a first thin plate made of quartz and a second thin plate made of silicon to provide for broadband achromatic rotation of polarization states of incoming beams. In some implementations, the adjustable birefringent optic 116 can be formed of multiple ostensibly distinct components. However, alternative embodiments may utilize various other birefringent optics and be constructed from various other materials. Such alternative optics may impact the polarization state of the combined feedback system input beam 154 and constituents thereof in a different manner.

After passing through the adjustable birefringent optic 116 a first time, the combined spatial filter input beam, or rotated combined input beam, 155 is reflected by the HR mirror 121 as a reflected combined spatial filter output beam, or a reflection of the rotated combined input beam 156, carrying optical power in a combination of TE and TM polarization states having a relative phase shift therebetween. In the embodiment depicted in FIG. 1, the adjustable birefringent optic 116 rotates the polarization state of the reflection of the rotated combined input beam or reflected combined spatial filter output beam 156 and eliminates the phase shift between the TE and TM polarization states of the reflected combined spatial filter output beam 156 to produce the first combined feedback system output beam 157A (which has a TE polarization state) and the second combined feedback system output beam 157B (which has a TM polarization state). The first combined feedback system output beam 157A and the second combined feedback system output beam 157B together constitute the combined feedback system output beam 157. The first combined feedback system output beam 157A includes a plurality of first feedback system output component beams, and the second combined feedback system output beam 157B includes a plurality of second feedback system output component beams. The relative amount of optical power carried by the first combined feedback system output beam 157A and by the second combined feedback system output beam 157B can be varied through adjustments to the adjustable birefringent optic 116. For example, the quarter wave plate of the embodiment depicted in FIG. 1 can be rotated in order to divert relatively larger or smaller amounts of optical power into the different components of the combined feedback system output beam 157.

The beam splitting system 104 includes the polarizing beam splitter 115. The polarizing beam splitter 115 separates the first combined feedback system output beam 157A and the second combined feedback system output beam 157B by transmitting the first combined feedback system output beam 157A as the combined output beam 158 (which carries its optical power in the TE polarization state) and reflecting the second combined feedback system output beam 157B as the combined feedback beam 159 (which carries its optical power in the TM polarization state). In practice, it is necessary to return less than 50% of the optical power carried by the emitted beams 151 as feedback and therefore necessary to direct less than 50% of the optical power carried by the emitted beams 151 into the second combined feedback system output component beam 157B (and thus the combined feedback beam 159). In order to achieve high operational efficiency of the DWBC system 100, it is preferable to return less than 15% of the optical power carried by the emitted beams 151 as feedback and therefore necessary to direct less than 15% of the optical power carried by the emitted beams 151 into the combined feedback beam 159. Through product testing and experimentation, it has been determined that optimal operation of the DWBC system 100 is achieved when approximately 4% to approximately 10% of the optical power carried by the emitted beams 151 is directed into the combined feedback beam 159.

After emerging from the polarizing beam splitter 115, the combined feedback beam 159, which retains the TM polarization state of the second combined feedback system output beam 157B and which includes a plurality of spatially and directionally overlapped single wavelength beams (i.e. the second feedback system output component beams), is incident on the angular dispersive optic 114. The plurality of spatially and directionally overlapped single wavelength beams of the combined feedback beam 159 emerge from the angular dispersive optic 114 as feedback beams 160 that together possess a wavelength-dependent angular spectrum imparted by the angular dispersive optic 114. The feedback beams 160 are directed towards the laser source 111 through the birefringent optic 113 and the position-to-angle transform optic 112. The birefringent optic 113 rotates the polarization of each constituent of the feedback beams 160, and the position-to-angle transform optic 112 directs each constituent of the feedback beams 160 into an individual emitter of the laser source 111. The combined feedback beam 159 is thereby directed back to the plurality of beam emitters of the laser source 111 to stabilize the wavelengths of the emitted beams 151.

Specifically, the position-to-angle transform optic 112 images the feedback beams 160 onto the laser source 111. Specifically, the position-to-angle transform optic 112 directs each constituent of the feedback beams 160 into an individual emitter of the laser source 111 by converting the wavelength-dependent angular spectrum imparted on the feedback beams 160 by the angular dispersive optic 114 into a wavelength-position spectrum that corresponds to the set of preferred resonant mode wavelengths and spatial positions of each emitter in the laser source 111. In this manner, each constituent of the feedback beams 160 is directed into the emitter in the laser source 111 that emitted the corresponding constituent of the emitted beams 151. As a result, each emitter (or channel) in the laser source 111 adjusts the wavelength of the constituent of the emitted beams 151 that it emits to match the wavelength selected for it by the external resonator. While each channel adjusts to a single wavelength, the configuration does not preclude the possibility that multiple channels will each emit beams of the same wavelength. For example, in situations where the laser source 111 is a stack of diode bars, it may be possible that individual emitters from different diode bars emit beams of the same wavelength.

As mentioned supra, the optional spatial filtering element 117 can be integrated into the adjustable feedback system 103 in order to increase beam quality by mitigating the impact of alternative resonant mode components. In the embodiment depicted in FIG. 1, the spatial filtering element 117 includes two position-to-angle transform optics 118 and 120 positioned about either side of an aperture 119 along the optical path between the adjustable birefringent optic 116 and the HR mirror 121. The aperture 119 filters alternative resonant mode components of each constituent of the emitted beams 151 by only allowing beams with the common direction of propagation of the combined spatial filter input beam (or rotated combined input beam) 155 (which is inherited from the combined input beam 153) to pass through. The two position-to-angle transform optics 118 and 120 increase the fidelity with which the aperture 119 filters out alternative resonant mode components by magnifying the angular spectrum (with respect to the common direction of propagation of the combined spatial filter input beam 155) possessed by the alternative resonant mode components (thereby ensuring that such components do not pass through the aperture 119). In this manner, alternative resonant mode components of the constituents of the emitted beams 151 are eliminated from the combined output beam 158. The alternative resonant mode components are also prevented from reaching the emitters of the laser source 111 as feedback and thereby prevented from causing spectral cross-talk.

In alternative implementations, the spatial filtering element 117 may be a waveguide structure, a set of mirrors that have a gradient layer, or any other component or set of components capable of filtering undesired alternative resonant mode components. In alternative embodiments to that depicted in FIG. 1, the alternative resonant mode components of each constituent of the emitted beams 151 can be filtered without the use of the spatial filtering element 117 but instead by separating the angular dispersive optic 114 from the HR mirror 121 by a sufficiently long optical path. In such embodiments, after emerging from the angular dispersive optic 114, the alternative resonant mode components diverge from the optical path of the combined input beam 153 (and thus the combined feedback system input beam 154 and the rotated combined input beam 155) prior to reaching the highly reflective mirror 121 and therefore are not reflected. In these alternative embodiments, the spatial filtering element 117, including, e.g., an aperture, a waveguide structure, a set of mirrors that have a gradient layer, etc., can be omitted.

FIGS. 2A and 2B illustrate configurations of laser sources for use in an external cavity laser apparatus wherein the laser sources are arrays of diode lasers formed from horizontal stacks of diode bars. FIGS. 2A and 2B both illustrate laser sources that are arrays of m·N diode lasers formed from a horizontal stack of N diode bars that each has m individual diode laser emitters. The configurations of the laser sources depicted in FIGS. 2A and 2B may be any of a geometrically stacked configuration (a geometric stack), an optically stacked configuration (an optical stack), or any other means of configuring a plurality of beams. In the configuration illustrated in FIG. 2A, each of the m individual emitters of array of diode lasers 200A has a slow axis that is parallel to the direction of horizontal stacking. When the combining axis is parallel to the slow axis of the emitters, the profile of a combined output beam produced by a DWBC laser apparatus having a laser source configured as the array of diode lasers 200A is depicted as element 201A. In the configuration illustrated in FIG. 2B, each of the m individual emitters of the array of diode lasers 200B has a fast axis that is parallel to the direction of horizontal stacking. When the combining axis is parallel to the slow axis of the emitters, the profile of a combined output beam produced by a DWBC laser apparatus having a laser source configured as the array of diode lasers 200B is depicted as element 201B. However, the configuration illustrated in FIG. 2A can produce a combined output beam with profile 201B and the configuration illustrated in FIG. 2B can produce a combined output beam with profile 201A through the utilization of suitable transformation optics, e.g. a beam rotator or beam twister.

Figure 3A:
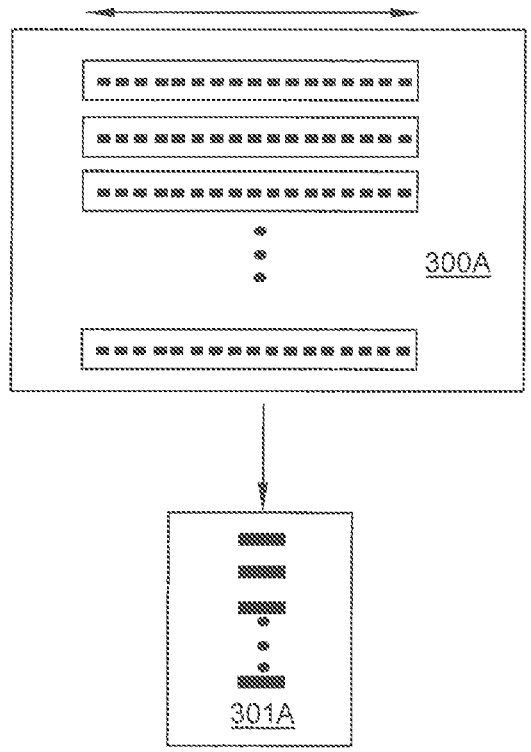
FIGS. 3A, 3B, and 3C illustrate configurations of laser sources for use in an external cavity laser apparatus wherein the laser sources are arrays of diode lasers formed from vertical stacks of diode bars.
Figure 3B:
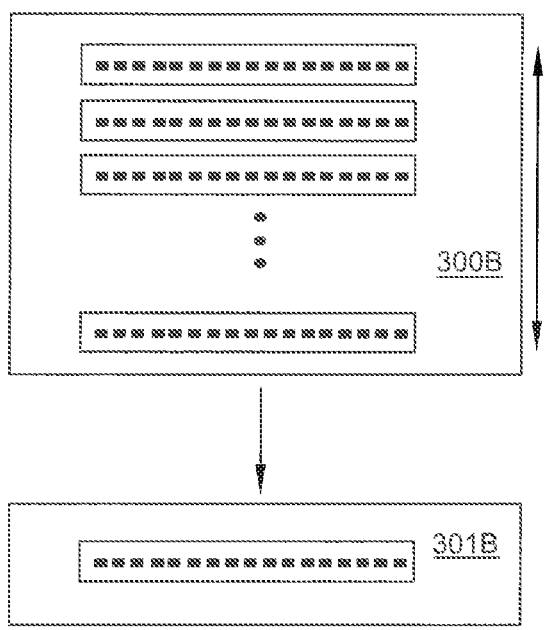
Figure 3C:
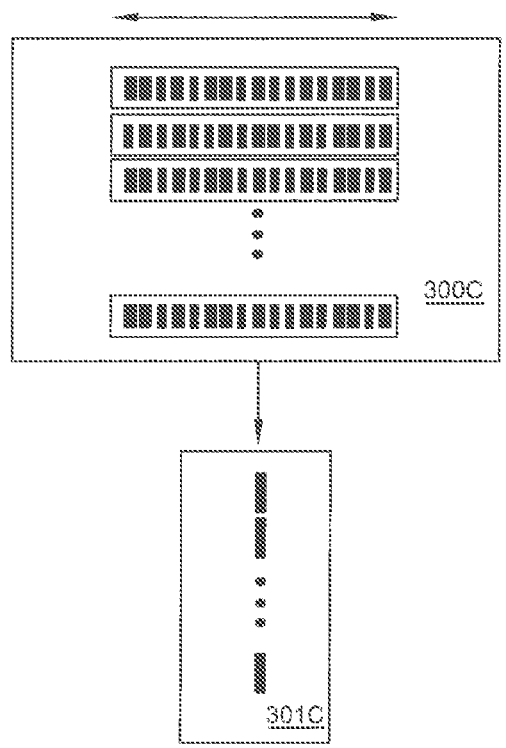

FIGS. 3A, 3B, and 3C illustrate configurations of laser sources for use in an external cavity laser apparatus wherein the laser sources are arrays of diode lasers formed from vertical stacks of diode bars. FIGS. 3A, 3B, and 3C all illustrate laser sources that are arrays of m·N diode lasers formed from a vertical stack of N diode bars that each has m individual diode laser emitters. The configurations of the laser sources depicted in FIGS. 3A, 3B, and 3C may be any of a geometrically stacked configuration (a geometric stack), an optically stacked configuration (an optical stack), or any other means of configuring a plurality of beams. In the configuration illustrated in FIG. 3A, each of the m individual emitters of array of diode lasers 300A has a slow axis that is perpendicular to the direction of vertical stacking. When the combining axis is parallel to the slow axis of the emitters, the profile of a combined output beam produced by a DWBC laser apparatus having a laser source configured as the array of diode lasers 300A is depicted as element 301A. In the configuration illustrated in FIG. 3B, each of the m individual emitters of array of diode lasers 300B has a fast axis that is parallel to the direction of vertical stacking. When the combining axis is parallel to the fast axis of the emitters, the profile of a combined output beam produced by a DWBC laser apparatus having a laser source configured as the array of diode lasers 300B is depicted as element 301B. In the configuration illustrated in FIG. 3C, each of the m individual emitters of array of diode lasers 300C has a fast axis that is perpendicular to the direction of vertical stacking. When the combining axis is parallel to the fast axis of the emitters, the profile of a combined output beam produced by a DWBC laser apparatus having a laser source configured as the array of diode lasers 300C is depicted as element 301C. However, the various configurations illustrated in FIGS. 3A-C can produce combined output beams with various different profiles through the utilization of suitable transformation optics, e.g. beam rotators. Such transformation optics and the transformations they are able to produce are shown, e.g., in U.S. Pat. No. 8,553,327, which is incorporated herein by reference.

Figure 4:
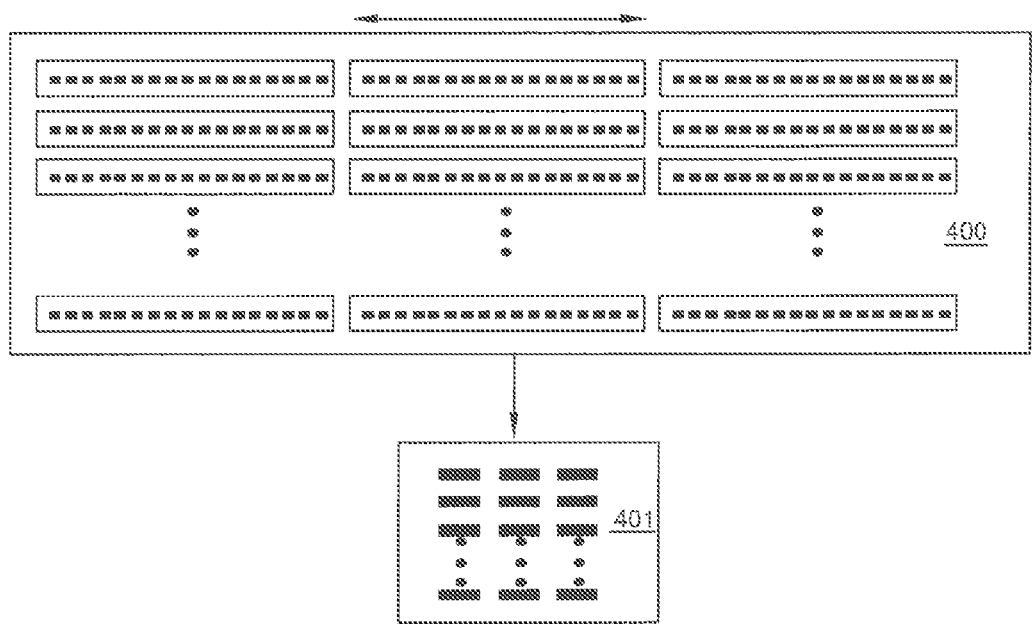
FIG. 4 illustrates a configuration of a laser source for use in an external cavity laser apparatus wherein the laser source is an array of diode lasers formed from a two-dimensional stack of diode bars.

FIG. 4 illustrates a configuration of a laser source for use in an external cavity laser apparatus wherein the laser source is an array of diode lasers formed from a two-dimensional stack of diode bars. FIG. 4 illustrates a laser source that is an array 400 of three columns of N diode bars that each has m individual emitters. In other words, the array 400 includes a horizontal stack of three vertical stacks of N diode bars, or alternatively, the array 400 includes a vertical stack of N horizontal stacks of three diode bars. In the configuration illustrated in FIG. 4, each of the 3·m·N individual diode emitters has a fast axis that is parallel to the direction of horizontal stacking. The configurations of the laser sources depicted in FIG. 4 may be any of a geometrically stacked configuration (a geometric stack), an optically stacked configuration (an optical stack), or any other means of configuring a plurality of beams. When the combining axis is parallel to the slow axis of the emitters, the profile of a combined output beam produced by a DWBC laser apparatus having a laser source configured as the array 400 is depicted as element 401. However, the configuration illustrated in FIG. 4 can produce combined output beams with different profiles if the emitters have their fast axis aligned perpendicular to the direction of horizontal stacking, i.e. parallel to the direction of vertical stacking. Furthermore, the configuration illustrated in FIG. 4 can produce combined output beams with various different profiles through the utilization of suitable transformation optics, e.g. beam rotators. Such transformation optics and the transformations they are able to produce are shown, e.g., in U.S. Pat. Nos. 8,724,222 and 8,553,327.

The proposed wavelength stabilization and combining system can be used in conjunction with any kind of stacked laser diodes bars. Therefore, the individual beams can be combined both in a direction along the emitter array dimension of the individual bar or in a direction perpendicular thereto. As a consequence, the resulting combined beam can have the appearance of either a virtual bar or a virtual emitter. For some applications, it is desirable to end up with a virtual emitter that requires a horizontal stacking of the plurality of diode bars in order to obtain a desirable beam quality after the beam combining process. In the case of a horizontal stacked array of conventional broad-area diode laser bars (BALs), one would typically combine all the individual emitters along their slow-axes (SA). For some applications, this combining scheme has as a drawback that the beam quality along the slow axis of each emitter is already close to the desired value (~3 mm·mrad). Therefore, any beam quality deterioration due to excess line width and optical aberration can result in further degradation to the beam quality, which can limit efficient coupling into a 5 mm·mrad fiber. For broad-area diode bars, this issue can be resolved by using micro-optic beam rotators which rotate the individual emitters by 90 degrees about their axis of propagation. The direction of beam combining can then be performed along the desired axis of each emitter, allowing for slight deterioration in beam quality while enabling production of a beam with a beam parameter product of less than 2 mm·mrad. However, when using alternative diode laser bar architectures, e.g., single-mode diode laser arrays, slab-coupled optical waveguide laser arrays (SCOWL), or rotated single emitter BAL arrays, one can omit the beam rotating micro-optic elements and use the emitted beams for wavelength beam combining directly.

Figure 5:
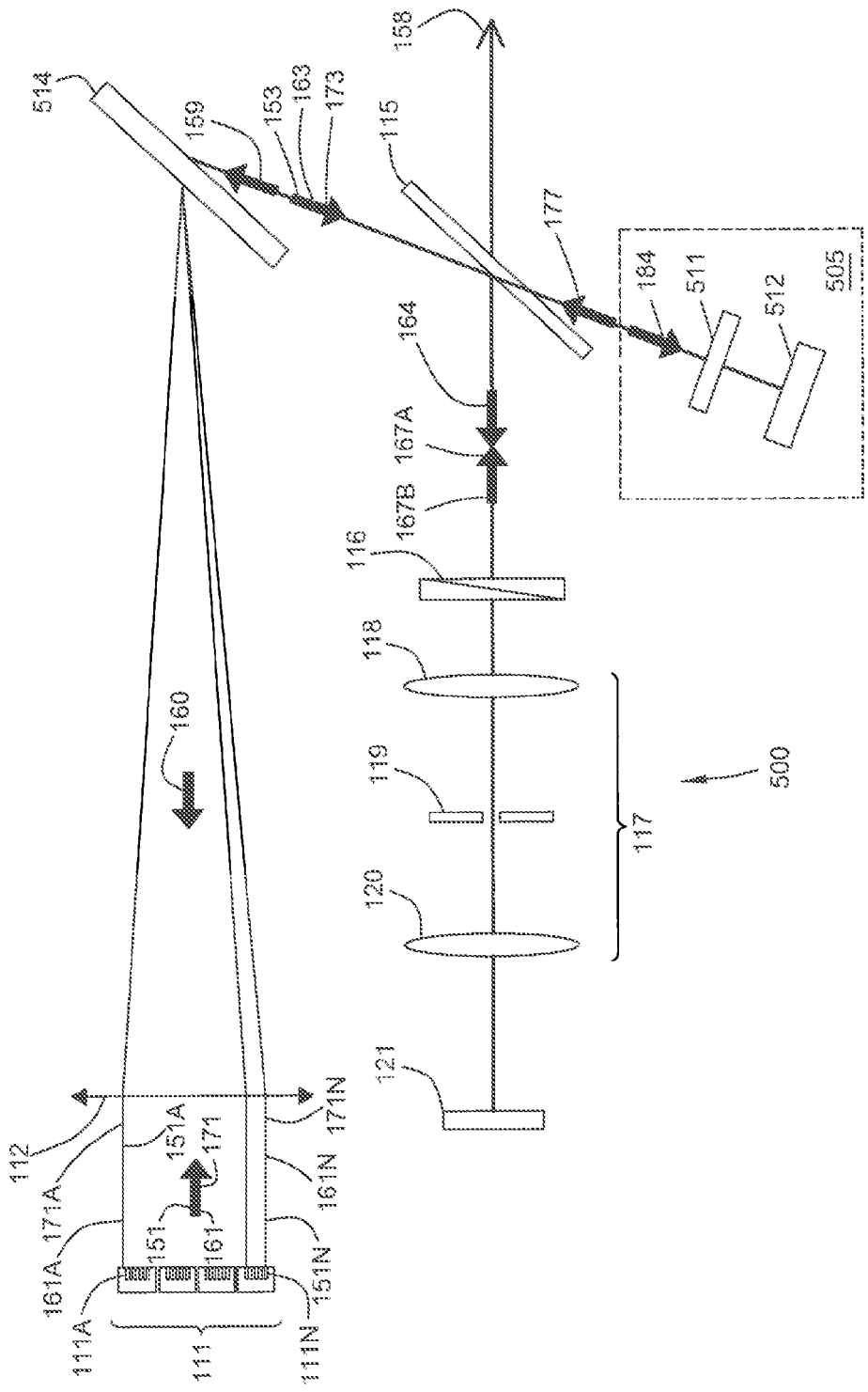
FIG. 5 illustrates an apparatus, according to an embodiment of the invention, for producing, via dense wavelength beam combining (DWBC) techniques, a single, multi-wavelength output laser beam comprising a plurality of spatially and directionally overlapped beams that each has a narrow wavelength spectrum.

FIG. 5 illustrates an apparatus, according to an embodiment of the invention, for producing, via dense wavelength beam combining techniques, a single, multi-wavelength output laser beam comprising a plurality of spatially and directionally overlapped beams that each has a narrow wavelength spectrum. The DWBC apparatus 500 depicted in FIG. 5 includes nearly all of the same components depicted in FIG. 1. However, in the embodiment depicted in FIG. 5, the external resonator input beams, or emitted beams, 151 carry the majority of their optical power in primary external resonator component emitted beams 161 (in the TM polarization state) but also carry a non-negligible amount of optical power in secondary external resonator component emitted beams 171 (in the TE polarization state). The secondary external resonator component emitted beams 171 can result from small variations in manufacturing processes and in operational conditions as well as from external stress on the individual emitters during the process of mounting during manufacture. Such external stress can result from hard soldering of diode bars during the manufacturing process. Hard-soldered diode bars provide for long-term operational stability but mechanical stress introduced during the hard-soldering mounting process can result in a roughly ten to twenty percent depolarization of the emitted beams (i.e. ten to twenty percent of the optical power of the emitted beams is carried in a polarization state orthogonal to the polarization state that carries the remaining optical power of the emitted beams).

In order to utilize the optical power carried in the secondary external resonator component emitted beams 171, the DWBC apparatus 500 utilizes beam recycling system 505. The beam recycling system 505 provides a means for coupling the secondary external resonator component emitted beams 171 into the combined external resonator output beam 158. The beam recycling system 505 includes birefringent optic 511 and high reflectivity (HR) mirror 512.

In the embodiment illustrated in FIG. 5, the external resonator input beams 151 are emitted by the plurality of individual emitters of the laser source 111. For simplicity, the external resonator input beams 151 will be referred to simply as emitted beams 151 for the remainder of the description of FIG. 5. The emitted beams 151 include, e.g., emitted beam 151A and emitted beam 151N. In the embodiment depicted in FIG. 5, the emitted beams 151 carry optical power in both primary external resonator component emitted beams 161 (in the TM polarization state) and secondary external resonator component emitted beams 171 (in the TE polarization state). The respective polarization states of the primary external resonator component emitted beams 161 and the secondary external resonator component emitted beams 171 can be a result of the rotation of the optical power emitted by the laser source, for example, by a birefringent element such as the birefringent element 113 of FIG. 1. As depicted in FIG. 5, the emitted beams 151, including both the TM polarized primary external resonator component emitted beams 161 and the TE polarized secondary external resonator component emitted beams 171, possess an angular spectrum with respect to the angular dispersive optic 114.

An angular dispersive optic 514 (which replaces the angular dispersive optic 114 of FIG. 1) transforms the angular spectrum possessed by the TM polarized primary external resonator component emitted beams 161 and the TE polarized secondary external resonator component emitted beams 171 into a wavelength-dependent angular spectrum. In the embodiment depicted in FIG. 5, the angular dispersive optic 514 is a polarization insensitive optic, and specifically, a polarization insensitive grating. The angular dispersive optic 514 is positioned such that a preferred resonant mode component of each constituent of the primary external resonator component emitted beams 161 and of each constituent of the secondary external resonator component emitted beams 171 emerges from the angular dispersive optic 514 with a common direction of propagation and as a component of the combined input beam 153. The combined input beam 153 is a combined multi-wavelength beam that includes a plurality of individual constituent beams, each of which corresponds to a constituent of the emitted beams 151. The combined input beam 153 carries its optical power in both TM polarized primary combined input beam 163 (which corresponds to the external resonator component emitted beams 161) and TE polarized secondary combined input beam 173 (which corresponds to the external resonator component emitted beams 171).

The polarizing beam splitter 115 separates the combined input beam 153 by reflecting the primary combined input beam 163 as combined primary feedback system input beam 164 and by transmitting the secondary combined input beam 173 as combined beam recycler input beam 184. The combined primary feedback system input beam 164 is a combined multi-wavelength laser beam that includes a plurality of individual constituent beams, each of which corresponds to a constituent of the component emitted beams 161, having TM polarization states. The combined beam recycler input beam 184 is a combined multi-wavelength laser beam that includes a plurality of individual constituent beams, each of which corresponds to a constituent of the component emitted beams 171, having TE polarization states.

The combined primary feedback system input beam 164 of FIG. 5 interacts with the adjustable birefringent optic 116 and the high reflectivity (HR) mirror 121 in the same manner as the combined feedback system input beam 154 of FIG. 1. Upon traversing through the adjustable birefringent optic 116 for a first time, reflecting from the HR mirror 121, and traveling through the adjustable birefringent optic 116 for a second time, the optical power carried by the combined primary feedback system input beam 164 emerges from the adjustable birefringent optic 116 as a first combined feedback system output beam 167A (which has the TE polarization state) and a second combined feedback system output beam 167B (which has the TM polarization state). The first combined feedback system output beam 167A, which includes a plurality of first feedback system output component beams, and the second combined feedback system output beam 167B, which includes a plurality of second feedback system output component beams, together constitute the combined primary feedback system output beam 167. The relative amount of optical power carried by the first combined feedback system output beam 167A and by the second combined feedback system output beam 167B can be varied through adjustments to the adjustable birefringent optic 116.

In the embodiment depicted in FIG. 5, the optional spatial filtering element 117 is disposed between the adjustable birefringent optic 116 and the HR mirror 121. The optional spatial filtering element 117 in FIG. 5 increases beam quality by mitigating the impact of alternative resonant mode components in the same manner as that described above in connection with FIG. 1.

The polarizing beam splitter 115 separates the first combined primary feedback system output beam 167A and the second combined primary feedback system output beam 167B in the embodiment depicted in FIG. 5 in the same manner that the polarizing beam splitter 115 separates the first combined feedback system output component beam 157A and the second combined feedback system output component beam 157B in the embodiment depicted in FIG. 1. Therefore, the first combined primary feedback system output beam 167A is transmitted as a component of the combined external resonator output beam 158 and the second combined feedback system output beam 157B is reflected as the combined feedback beam 159. The combined feedback beam 159 propagates through the embodiment depicted in FIG. 5 in the same manner in which the combined feedback beam 159 propagates through the embodiment depicted in FIG. 1. The optical power carried by the combined feedback beam 159 is ultimately provided as feedback to the plurality of emitters that emitted the emitted beams 151.

The combined beam recycler input beam 184 is transmitted through the birefringent optic 511 and reflected by the HR mirror 512 back through the birefringent optic 511. The optical power carried by the combined beam recycler input beam 184 is rotated each time it passes through the birefringent optic 511 such that it emerges as combined beam recycler output beam 177, which can be referred to as a third combined feedback system output beam, and which, in the embodiment depicted in FIG. 5, is a combined multi-wavelength laser beam that carries its optical power in the TM polarization state. The combined beam recycler output beam is reflected by the polarizing beam splitter 115 as a component of the combined external resonator output beam 158.

Figure 6:
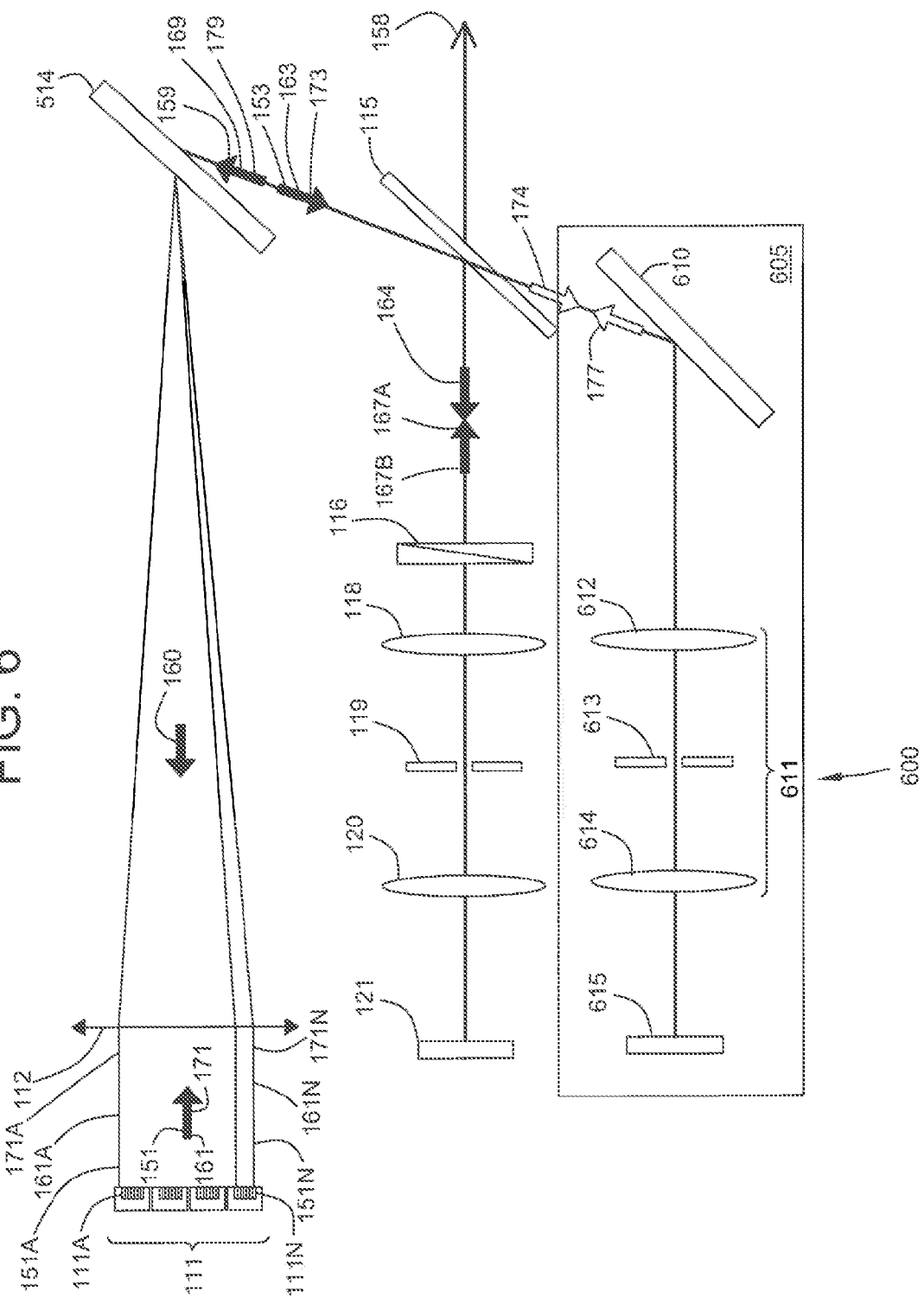
FIG. 6 illustrates an apparatus, according to an embodiment of the invention, for producing, via dense wavelength beam combining (DWBC) techniques, a single, multi-wavelength output laser beam comprising a plurality of spatially and directionally overlapped beams that each has a narrow wavelength spectrum.

FIG. 6 illustrates an apparatus, according to an embodiment of the invention, for producing, via dense wavelength beam combining techniques, a single, multi-wavelength output laser beam comprising a plurality of spatially and directionally overlapped beams that each has a narrow wavelength spectrum. The DWBC apparatus 600 depicted in FIG. 6 includes many of the same components depicted in FIG. 1. However, as with the embodiment depicted in FIG. 5, in the embodiment depicted in FIG. 6, the external resonator emitted beams 151 carry the majority of their optical power in primary external resonator component emitted beams 161 (in the TM polarization state) but also carry a non-negligible amount of optical power in secondary external resonator component emitted beams 171 (in the TE polarization state). As in FIG. 5, the angular dispersive optic 514 (which is a polarization insensitive optic) replaces the angular dispersive optic 114.

In order to utilize the optical power carried in the secondary external resonator component emitted beams 171, the DWBC apparatus 600 utilizes a second feedback system 605. The second feedback system 605 provides a means for coupling the secondary external resonator component emitted beams 171 into the combined feedback beam 159. The second feedback system 605 includes spatial filtering element 611 and high reflectivity (HR) mirrors 610 and 615.

In the embodiment illustrated in FIG. 6, the external resonator emitted beams 151 are emitted by a plurality of individual emitters of a laser source, such as the laser source 111 depicted in FIG. 1. For simplicity, the external resonator emitted beams 151 will be referred to simply as emitted beams 151 for the remainder of the description of FIG. 6. The emitted beams 151 include, e.g., input beam 151A and input beam 151N. In the embodiment depicted in FIG. 6, the emitted beams 151 carry optical power in both primary external resonator component emitted beams 161 (in the TM polarization state) and secondary external resonator component emitted beams 171 (in the TE polarization state).

The primary external resonator component emitted beams 161 in FIG. 6 propagate through the DWBC apparatus 600 in the same manner in which they propagate through the DWBC apparatus 500 of FIG. 5. The optical power carried by the primary external resonator component emitted beams 161 in FIG. 6 is therefore ultimately divided between the combined external resonator output beam 158 and the first combined feedback beam 169.

The secondary external resonator component emitted beams 171 in FIG. 6 propagate through the DWBC apparatus 600 in the same manner in which they propagate through the DWBC apparatus 500 of FIG. 5 until they reach the polarizing beam splitter 115 as the secondary combined input beam 173. In FIG. 6, the secondary combined input beam 173 is transmitted by the polarizing beam splitter as combined secondary feedback system input beam 174. The combined secondary feedback system input beam 174 is a combined, multi-wavelength beam consisting of a plurality of constituent beams that are each TE polarized.

In the embodiment depicted in FIG. 6, an optional spatial filtering element 611 increases beam quality by mitigating the impact of alternative resonant mode components in the same manner as described above in connection with the optional spatial filtering element 117 of FIG. 1. The optional spatial filtering element 611 includes two position-to-angle transform optics 612 and 614 positioned about either side of an aperture 613 along the optical path between the HR mirrors 610 and 615. The aperture 613 filters alternative resonant mode components of each constituent of the secondary external resonator component emitted beams 171 by only allowing beams with the common direction of propagation of the combined secondary feedback system input beam 174 (which is inherited from the secondary combined input beam 173) to pass through. The two position-to-angle transform optics 612 and 614 increase the fidelity with which the aperture 613 filters out alternative resonant mode components by magnifying the angular spectrum (with respect to the common direction of propagation of the combined secondary feedback system input beam 174) possessed by the alternative resonant mode components (thereby ensuring that such components do not pass through the aperture 613). In this manner, alternative resonant mode components of the constituents of the secondary external resonator component emitted beams 171 are eliminated from the combined secondary feedback system output beam, or third combined feedback system output beam, 177.

In alternative implementations, the spatial filtering element 611 may be a waveguide structure, a set of mirrors that have a gradient layer, or any other component or set of components capable of filtering undesired alternative resonant mode components. In alternative embodiments, the alternative resonant mode components of each constituent of the secondary external resonator component emitted beams 171 can be filtered without the use of the spatial filtering element 611 but instead by separating the angular dispersive optic 114 from the HR mirror 615 by a sufficiently long optical path. In such embodiments, after emerging from the angular dispersive optic 114, the alternative resonant mode components diverge from the optical path of the secondary combined input beam 173 (and thus of the combined secondary feedback system input beam 174) prior to reaching the HR mirror 615 and therefore are not reflected.

After passing through the spatial filtering element 611, the combined secondary feedback system input beam 174 is reflected by the HR mirror 615 back through the spatial filtering element 611 and thereafter reflected by the HR mirror 610 back into the polarizing beam splitter 115 as combined secondary feedback system output beam, or third combined feedback system output beam, 177. The third combined feedback system output beam 177 of FIG. 6 is a combined, multi-wavelength laser beam composed of a plurality of spatially and directionally overlapped TE polarized constituent beams. The third combined feedback system output beam 177 is transmitted by the polarizing beam splitter 115 as second combined feedback beam 179. The second combined feedback beam 179 carries optical power in the TE polarization state. The optical power carried in the second combined feedback beam 179 is ultimately provided as feedback to the plurality of emitters that emitted the emitted beams 151 (by propagating through the DWBC apparatus 600 in the same manner that the combined feedback beam 159 propagates through the DWBC apparatus 100 depicted in FIG. 1.

In practice, it is necessary to return less than 50% of the optical power carried by the emitted beams 151 as feedback and therefore necessary to direct less than 50% of the optical power carried by the emitted beams 151 into the combination of the first combined feedback beam component 169 and the second feedback beam component 179 (and thus the combined feedback beam 159). In order to achieve high operational efficiency of the DWBC system 100, it is preferable to return less than 15% of the optical power carried by the emitted beams 151 as feedback and therefore necessary to direct less than 15% of the optical power carried by the emitted beams 151 into the combined feedback beam 159. Through product testing and experimentation, it has been determined that optimal operation of the DWBC system 100 is achieved when approximately 4% to approximately 10% of the optical power carried by the emitted beams 151 is directed into the combined feedback beam 159. In the embodiment depicted in FIG. 6, the amount of optical power carried by the second feedback beam component 179 is a function of the degree of depolarization of the individual emitters that emit the emitted beams 151. Therefore, in order to achieve a desired amount of feedback, the adjustable birefringent optic 116 is adjusted such that the relative optical power carried by each of the first combined primary feedback system output beam component 167A and the second combined primary feedback system output beam component 167B provides for delivery of the desired amount of total feedback to the individual emitters that emit the emitted beams 151.

It is thus contemplated that other implementations of the invention may differ in detail from foregoing examples. As such, all references to the invention are intended to reference the particular example of the invention being discussed at that point in the description and are not intended to imply any limitation as to the scope of the invention more generally. All language of distinction and disparagement with respect to certain features is intended to indicate a lack of preference for those features, but not to exclude such from the scope of the invention entirely unless otherwise indicated.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. An external cavity laser apparatus comprising:
a plurality of beam emitters that collectively emit a plurality of emitted beams each including a primary component emitted beam and having a wavelength;
an angular dispersive optic disposed in the optical path of the plurality of primary component emitted beams and configured to combine the plurality of primary component emitted beams into a combined input beam, the combined input beam including a plurality of component input beams;
a first polarizing optic disposed in the optical path of the combined input beam and configured to:
rotate a polarization of each of the plurality of component beams of the combined input beam to produce a rotated combined input beam, the rotated combined input beam including a plurality of rotated component input beams, and
rotate a polarization of a reflection of each of the plurality of rotated component input beams of the rotated combined input beam to produce a first combined feedback system output beam having a first linear polarization and a second combined feedback system output beam having a second linear polarization, wherein the first combined feedback system output beam includes a plurality of first feedback system output component beams and wherein the second combined feedback system output beam includes a plurality of second feedback system output component beams; and
a polarized beam splitter configured to:
direct the first combined feedback system output beam as a single combined output beam, and
direct the second combined feedback system output beam to the angular dispersive optic as a first single combined feedback beam,
the angular dispersive optic being further configured to:
split the first single combined feedback beam into a plurality of first feedback beams, and
direct the plurality of first feedback beams back to the plurality of beam emitters to stabilize the wavelengths of the plurality of emitted beams.

2. The apparatus of claim 1, wherein the polarized beam splitter is further configured to direct the combined input beam to the first polarizing optic.

3. The apparatus of claim 1, wherein each of the plurality of emitted beams additionally includes a secondary component emitted beam.

4. The apparatus of claim 3, further comprising a reflective element;
wherein the polarized beam splitter is further configured to direct the plurality of secondary component emitted beams to the reflective element.

5. The apparatus of claim 1, wherein the dispersive optic is a polarization insensitive grating.

6. The apparatus of claim 1, further comprising a first reflective element configured to reflect the rotated combined input beam to produce a reflected rotated combined input beam, wherein the reflected rotated combined input beam includes the reflection of each of the plurality of rotated component input beams.

7. The apparatus of claim 6, wherein a second reflective element is configured to direct a reflection of a plurality of secondary component emitted beams as a plurality of components of a third feedback system output beam to the polarized beam splitter, and
wherein the polarized beam splitter is further configured to direct the plurality of components of the third feedback system output beam to the plurality of beam emitters.

8. The apparatus of claim 6, wherein a second reflective element is configured to direct a reflection of a plurality of secondary component emitted beams as a plurality of components of a third feedback system output beam to the polarized beam splitter, and
wherein the polarized beam splitter is configured to direct the plurality of components of the third feedback system output beams as components of the single combined output beam.

9. The apparatus of claim 1, wherein the angular dispersive optic has a wavelength-dependent angular dispersion function, and
wherein the angular dispersive optic is configured to combine the plurality of primary component emitted beams into a combined input beam by being configured to impart a wavelength-dependent angular spectrum determined by the wavelength-dependent angular dispersion function on the plurality of primary component emitted beams.

10. The apparatus of claim 9, further comprising a first position-to-angle transform optic disposed in an optical path between the plurality of beam emitters and the angular dispersive optic and configured to impart upon each of the plurality of emitted beams an angle of incidence with respect to the angular dispersive optic.

11. The apparatus of claim 10, further comprising a second polarizing optic disposed between the plurality of beam emitters and the angular dispersive optic and configured to rotate a polarization of each of the plurality of emitted beams.

12. The apparatus of claim 11, wherein the second polarizing optic is a half wave plate.

13. The apparatus of claim 9, further comprising a spatial filtering assembly disposed in an optical path of one of the combined input beam and the rotated combined input beam and configured to transmit only component beams that correspond to a portion of the wavelength-dependent angular spectrum.

14. The apparatus of claim 13, wherein the spatial filtering assembly comprises:
a second position-to-angle transform optic;
a third position-to-angle transform optic; and
an aperture disposed between the second position-to-angle transform optic and the third position-to-angle transform optic.

15. The apparatus of claim 14, wherein the array is formed from one of a plurality of diode bars configured in a vertical stack, a plurality of diode bars configured in a horizontal stack, or two-dimensional array of diode bars.

16. The apparatus of claim 1, wherein the plurality of beam emitters is one of a plurality of diode beam emitters arranged in a bar and a plurality of diode beam emitters arranged in an array.

17. The apparatus of claim 1, wherein the first polarizing optic is a quarter wave plate.

18. The apparatus of claim 1, wherein the second combined feedback system output beam has an optical power that is less than about 20% of an optical power of the plurality of emitted beams.

19. The system of claim 1, wherein the single combined output beam is a multi-wavelength beam that includes a plurality of spatially and directionally overlapped individual single wavelength beams.

20. The system of claim 1, wherein the first single combined feedback beam is a multi-wavelength beam that includes a plurality of spatially and directionally overlapped individual single wavelength beams.

21. The system of claim 1, wherein the angular dispersive optic is configured to direct each of the plurality of first feedback beams back to an emitter of the plurality of beam emitters that emitted one of the plurality of emitted beams to which it corresponds.

22. A method for stabilizing the wavelengths of a plurality of emitted beams collectively emitted by a plurality of emitters, each of the plurality of emitted beams including a primary component emitted beam, the method comprising:
    emitting, by the plurality of emitters, the plurality of emitted beams collectively including the plurality of primary component emitted beams;
    combining, by an angular dispersive optic disposed in the optical path of the plurality of primary component emitted beams, the plurality of primary component emitted beams into a combined input beam, the combined input beam including a plurality of component input beams;
    rotating, by a first polarizing optic, the plurality of component beams of the combined input beam to produce a rotated combined input beam, the rotated combined input beam including a plurality of rotated component input beams;
    rotating, by the first polarizing optic, the plurality of rotated component beams of the rotated combined input beam to produce a first combined feedback system output beam having a first linear polarization and a second combined feedback system output beam having a second linear polarization, wherein the first combined feedback system output beam includes a plurality of first feedback system output component beams and wherein the second combined feedback system output beam includes a plurality of second feedback system output component beams;
    directing, by a polarized beam splitter, the first combined feedback system output beam as a single combined output beam;
    directing, by the polarized beam splitter, the second combined feedback system output beam to the angular dispersive optic as a first single combined feedback beam;
    splitting, by the angular dispersive optic, the first single combined feedback beam into a plurality of first feedback beams; and
    directing, by the angular dispersive optic, the plurality of first feedback beams back to the plurality of beam emitters to stabilize the wavelengths of the plurality of emitted beams.

23. The method of claim 22, wherein each of the plurality of emitted beams includes a secondary component emitted beam, the method further comprising:
    directing, by the polarized beam splitter, the plurality of secondary component emitted beams to a reflective element;
    reflecting, by the reflective element, the plurality of secondary component emitted beams as components of a third combined feedback system output beam; and
    directing, by the polarized beam splitter, the components of the third combined feedback system output beam as components of one of a second feedback beam or the combined output beam.

24. The method of claim 22, wherein the single combined output beam is a multi-wavelength beam that includes a plurality of spatially and directionally overlapped individual single wavelength beams.

25. The method of claim 22, wherein the first single combined feedback beam is a multi-wavelength beam that includes a plurality of spatially and directionally overlapped individual single wavelength beams.

26. The method of claim 22, wherein directing the plurality of first feedback beams back to the plurality of beam emitters to stabilize the wavelengths of the plurality of emitted beams comprises directing each of the plurality of first feedback beams back to an emitter of the plurality of beam emitters that emitted one of the plurality of emitted beams to which it corresponds.

27. An external cavity laser apparatus comprising:
    a plurality of beam emitters that collectively emit a plurality of emitted beams each having a wavelength and including a primary component emitted beam and a secondary component emitted beam;
    an angular dispersive optic disposed in the optical path of the plurality of emitted beams and configured to combine the plurality of emitted beams into a combined input beam, the combined input beam including a primary combined input beam and a secondary combined input beam;
    a first polarizing optic disposed in the optical path of the primary combined input beam and configured to:
        rotate the primary combined input beam to produce a rotated primary combined input beam, and
        rotate a reflection of the rotated primary combined input beam to produce a first combined feedback system output beam having a first linear polarization and a second combined feedback system output beam having a second linear polarization, wherein the first combined feedback system output beam includes a plurality of first feedback system output component beams and wherein the second combined feedback system output beam includes a plurality of second feedback system output component beams; and
    a polarized beam splitter configured to:
        direct the primary combined input beam through the first polarizing optic at a first reflective element, and
        direct the secondary combined input beam at a second reflective element, the second reflective element configured to reflect the secondary combined input beam as a third combined feedback system output beam,
        direct the first combined feedback system output beam as a combined output beam,
        direct the second combined feedback system output beam to the angular dispersive optic as a first combined feedback beam and back to the emitters to stabilize the wavelength of the emitted beams, and
        direct the third combined feedback system output beam to the angular dispersive optic as a second combined feedback beam or direct the third combined feedback system output beam as a component of the combined output beam.

\* \* \* \* \*